US006096599A

United States Patent [19]
Kepler et al.

[11] Patent Number: 6,096,599
[45] Date of Patent: Aug. 1, 2000

[54] FORMATION OF JUNCTIONS BY DIFFUSION FROM A DOPED FILM INTO AND THROUGH A SILICIDE DURING SILICIDATION

[75] Inventors: Nick Kepler, Saratoga, Calif.; Karsten Wieczorek, Reichenberg-Boxdorf, Germany; Larry Wang, San Jose; Paul Raymond Besser, Sunnyvale, both of Calif.

[73] Assignee: Advanced Micro Devices, Inc., Sunnyvale, Calif.

[21] Appl. No.: 09/187,521

[22] Filed: Nov. 6, 1998

[51] Int. Cl.[7] .................................................. H01L 21/8242
[52] U.S. Cl. .......................... 438/249; 438/301; 438/392; 438/369; 438/542; 438/664; 438/923
[58] Field of Search ...................................... 438/249, 301, 438/378, 392, 365, 366, 368, 369, 418, 542, 546, 548, 549, 551, 553, 563, 663, 664, 923

[56] References Cited

U.S. PATENT DOCUMENTS

| | | |
|---|---|---|
| 5,217,924 | 6/1993 | Rodder et al. . |
| 5,420,058 | 5/1995 | Lee et al. . |
| 5,478,776 | 12/1995 | Luftman et al. . |
| 5,529,958 | 6/1996 | Yaoita . |
| 5,550,084 | 8/1996 | Anjum et al. . |
| 5,770,490 | 8/1996 | Frenette et al. . |
| 5,933,740 | 4/1996 | Chapman . |
| 5,970,370 | 12/1998 | Besser et al. . |
| 5,985,768 | 4/1997 | Speranza et al. . |
| 5,989,996 | 2/1998 | Kishi . |
| 5,998,271 | 2/1997 | Schwalke . |
| 6,025,242 | 1/1999 | Ma et al. . |

OTHER PUBLICATIONS

La Via, et al "Boron diffusion in Co74Ti26 amorphous alloy," Appl. Phys. Letters, vol. 60, Issue 6, pp. 701–703, Feb. 10, 1992.

Kim et al, "Effect of Ti–capping thickness on the formation of an oxide–interlayer–mediated–epitaxial CoSi2 film by ex situ annealing," Journ. Appl. Phys., vol. 85, No. 3, pp. 1503, Feb. 1, 1999.

Kim et al, "Interfacial reaction and formation mechanism of epitaxial CoSi2 by rapid thermal annealing in Co/Ti/Si(100) system," Journ. Appl. Phys. vol. 82, No. 5, pp. 2323, Sep. 1, 1997.

Materials and Bulk Processes, "Doping Technologies", The National Technology Roadmap for Semiconductors (1994), pp. 118–121.

"Ultra Shallow Junction Formation Using Diffusion from Silicides" H. Jiang, et al., J. Electrochem. Soc., vol. 139, No. 1, Jan. 1992, pp. 196–218.

Primary Examiner—John F. Niebling
Assistant Examiner—Jonathan Hack

[57] ABSTRACT

High integrity shallow source/drain junctions are formed employing cobalt silicide contacts. Embodiments include depositing a layer of cobalt on a substrate above intended source/drain regions, depositing a cap layer of titanium or titanium nitride on the cobalt, depositing a doped film on the cap layer, and performing silicidation, as by rapid thermal annealing, to form a low-resistivity cobalt silicide and to diffuse impurities from the doped film through the cobalt silicide into the substrate to form a junction extending into the substrate a constant depth below the cobalt silicide interface. The formation of source/drain junctions self-aligned to the cobalt silicide/silicon interface prevents junction leakage while allowing the formation of cobalt silicide contacts at optimum thickness, thereby facilitating reliable device scaling.

23 Claims, 6 Drawing Sheets

FORMATION OF JUNCTIONS BY DIFFUSION FROM A DOPED FILM INTO AND THROUGH A SILICIDE DURING SILICIDATION

RELATED APPPLICATIONS

This application contains subject matter related to subject matter disclosed in copending U.S. patent application Ser. No. 09/187,427, and U.S. patent application Ser. No. 09/318,824.

FIELD OF THE INVENTION

The present invention relates to a method of manufacturing a semiconductor device comprising refractory metal silicide contacts to source/drain and silicon gate regions. The present invention has particular applicability in manufacturing reliable high density semiconductor devices with submicron design features, shallow junction depths and cobalt silicide contacts to source/drain regions.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

In the manufacture of conventional complementary metal oxide semiconductor (CMOS) devices, referring to FIG. 1A, isolation regions 110, called field oxide regions, are formed in a semiconductor substrate 100 of silicon dioxide by local oxidation of silicon (LOCOS) or by shallow trench isolation (STI). A conductive gate 130, such as polysilicon, is also formed on substrate 100, with a gate oxide layer 120 in between. Dielectric spacers 140 are formed on sidewalls of the gate 130, and source/drain regions 150 are formed on either side of gate 130 by implantation of impurities.

As gate lengths are reduced to below 0.5 $\mu$, refractory metal silicide layers, such as titanium silicide, are typically formed over source/drain regions 150 and gate 130 to reduce the sheet resistivity of these components, thereby improving device performance. Referring to FIG. 1B, a titanium layer 160 is deposited, as by sputtering, over the entire substrate 100 as well as field oxide 110, gate 130 and spacers 140. A low temperature rapid thermal anneal (RTA) reaction creates a first-phase titanium silicide (C49) on the exposed silicon of gate 130 and source/drain regions 150. The unreacted titanium over field oxide 110 and spacers 140 is then removed, and a high temperature RTA reaction changes the first-phase titanium silicide into a low-resistivity second-phase titanium silicide 170 (C54), as shown in FIG. 1C. Since the titanium silicide does not form on field oxide 110 or spacers 140, it is self-aligned to the gate 130 and source/drain regions 150. Hence, the titanium silicide formed in this process is known as "titanium salicide" (self-aligned silicide).

Titanium salicide is effective in decreasing sheet resistivity if the gate length is greater than about 0.25 $\mu$. At a gate length of about 0.25 $\mu$ the titanium silicide sheet resistance rises dramatically due to narrow-line effects; that is, the low-resistivity silicide C54 does not completely form because first-phase C49 grains are very large (about 0.5 $\mu$), and hence there are fewer nucleation sites on the gate to nucleate the low resistance silicide C54 during the high temperature RTA.

To maintain low sheet resistance as gate lengths are decreased in scale below about 0.25 $\mu$, cobalt is typically used instead of titanium in silicide formation. Cobalt silicide does not display the undesirable narrow-line effects of titanium silicide because the conversion from its first-phase cobalt silicide to its low-resistivity second-phase cobalt silicide is a diffusion reaction, rather than the nucleation and growth reaction as with titanium silicide and, therefore, the relationship of grain size to gate size is not a limiting factor.

However, the cobalt salicide process has a drawback in that cobalt silicide is more likely than titanium silicide to cause source and drain junction leakage, which can result in unacceptably high power dissipation as well as functional failure. This problem becomes especially critical as gate lengths are scaled below 0.25 $\mu$, and source and drain junctions are typically made shallower to prevent transistor short-channel effects. Since shallow junctions are more susceptible to junction leakage than deep junctions, cobalt silicide related junction leakage effectively limits CMOS device scaling.

A cause of this junction leakage, referring to FIG. 2, is the unevenness of the interface between the cobalt silicide 210 and the silicon source/drain regions 220, which results in an insufficient distance between portions of the bottom of the cobalt silicide 210 and source/drain junctions 220a. When a junction 220a is biased, a depletion region (i.e., an area depleted of free carriers) is formed which extends on either side of the junction 220a. Since the distance the depletion region spreads from the junction 220a is inversely proportional to the doping of the region, and source/drain region 220 is more heavily doped than substrate 200, the depletion region spreads mainly into substrate 200. Nevertheless, if cobalt silicide 210 extends into the depletion spread, leakage can occur as carriers are swept across this highly charged region. Junction integrity can be maintained by providing a large enough distance between junction 220a and the interface of silicide 210 and source/drain region 220; i.e., by reducing the thickness of cobalt silicide 210. However, reducing its thickness increases the sheet resistivity of cobalt silicide 210, thus reducing its effectiveness.

There exists a need for a method of manufacturing a semiconductor device with a low-resistivity refractory metal silicide layer over its source/drain regions which does not cause junction leakage.

SUMMARY OF THE INVENTION

An advantage of the present invention is a method of manufacturing a semiconductor device having a metal silicide layer over its source/drain regions which does not adversely affect junction integrity.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a metal layer on a main surface of a semiconductor substrate; forming a cap layer on the metal layer; forming a doped layer having impurities on the cap layer; heating at a first temperature to form a first-phase metal silicide layer and to diffuse the impurities into the first-phase metal silicide layer; etching to remove the doped layer, the cap layer and unreacted portions of the metal layer; and heating at a second temperature to form a second-phase metal silicide layer having a resistivity lower than that of the first-phase metal silicide layer, and to diffuse the impurities into the substrate to form source/drain regions having a junction depth below the second-phase metal silicide layer.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from conventional methods of forming low resistivity cobalt silicide contacts on source/drain regions, particularly source/drain regions having ultra-shallow junction depth such as about 2000 Å and under; e.g., 500 Å and under. Such conventional cobalt silicide methodology results in an uneven interface between the cobalt silicide contacts and the silicon of the source/drain regions and a less than optimal distance between the cobalt silicide and the shallow source/drain junctions, thus causing junction leakage and preventing cost-effective device scaling.

According to the methodology of the present invention, a layer of metal, e.g., cobalt, is deposited on a substrate before forming the source/drain implants, i.e., above intended source/drain regions and above previously formed field oxide regions, gates and spacers. A cap layer, e.g. titanium, is deposited on the metal layer, and then a doped film is deposited on the cap layer. As used throughout the present disclosure and claims, the term "substrate" denotes a semiconductor substrate or an epitaxial layer formed on the semiconductor substrate. Silicidation is then performed to form the metal silicide contacts while diffusing the dopants to form source/drain regions having a junction depth which is substantially evenly spaced from the metal silicide/silicon interface. For example, silicidation can be carried out by RTA to form a low-resistivity cobalt silicide phase and to diffuse impurities from the doped film through the cobalt silicide and into the substrate to form the source/drain regions having a shallow junction. The impurities, which gain mobility when the doped film is heated, readily diffuse out of the doped film during the RTA process, and diffuse through the cobalt silicide into the substrate, as cobalt silicide does not have as great an affinity for dopants as the substrate silicon. Due to the high diffusivity of the impurities in the cobalt silicide, the impurities form a shallow source/drain junction self-aligned to the cobalt silicide/silicon interface, thus avoiding junction leakage independently of the interface shape and the cobalt silicide thickness.

Figure 1A:
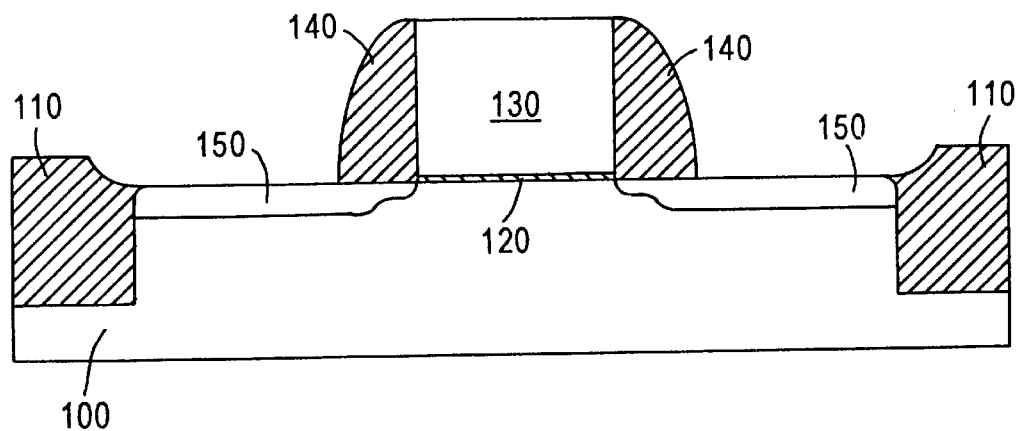
FIGS. 1A–1C schematically illustrate sequential phases of a conventional salicide technique.
Figure 1B:
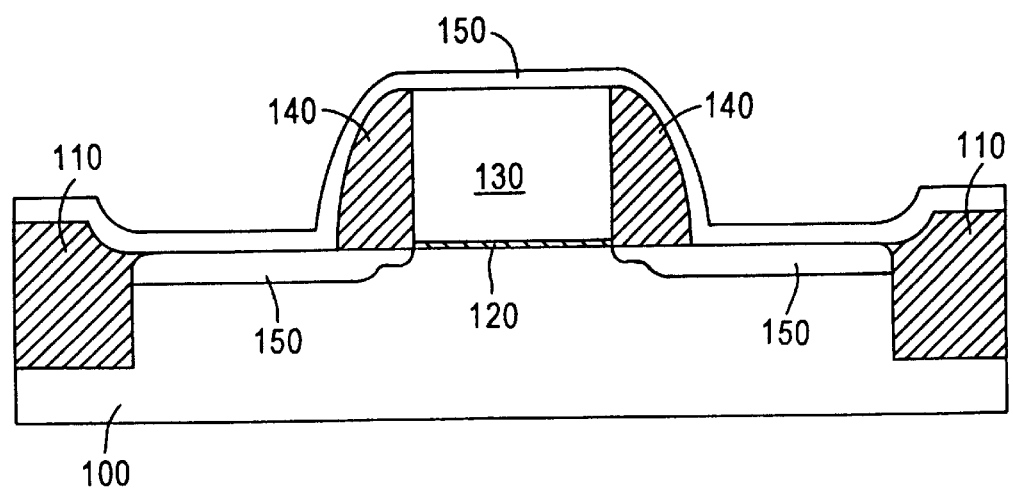
Figure 1C:
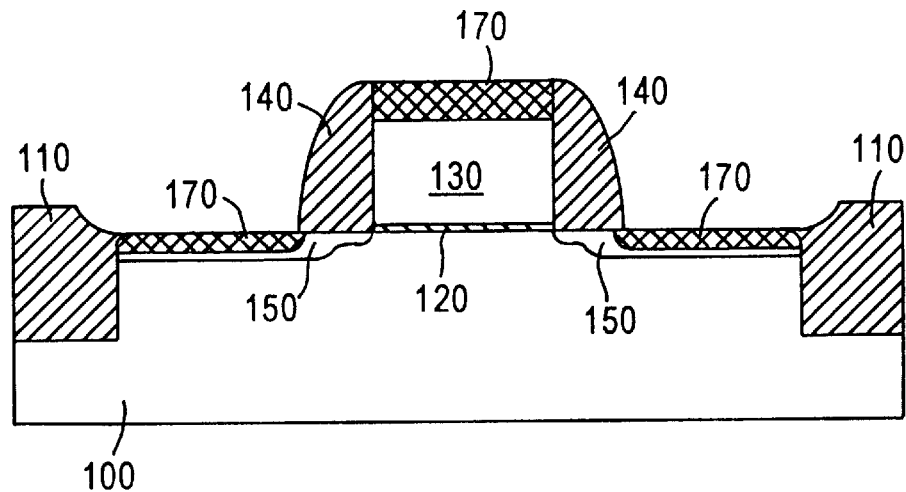
Figure 2:
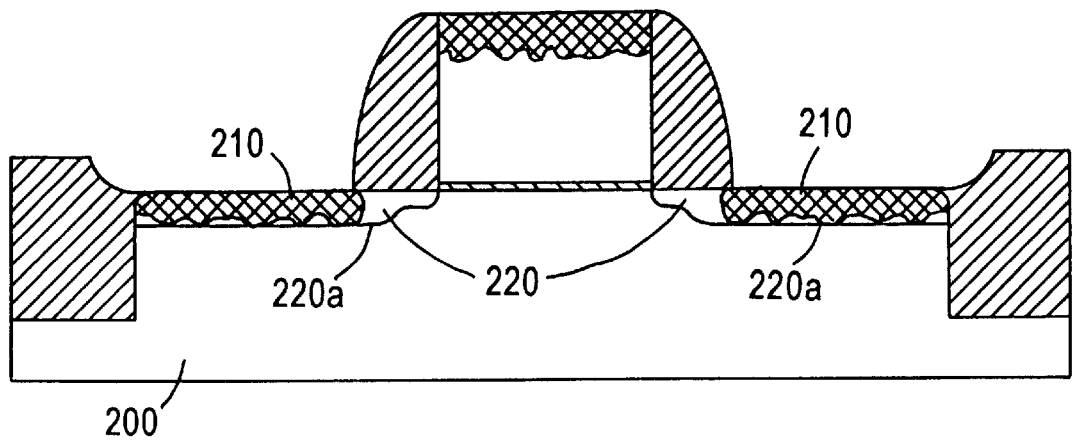
FIG. 2 depicts the results of a conventional method of cobalt salicide formation.
Figure 3A:
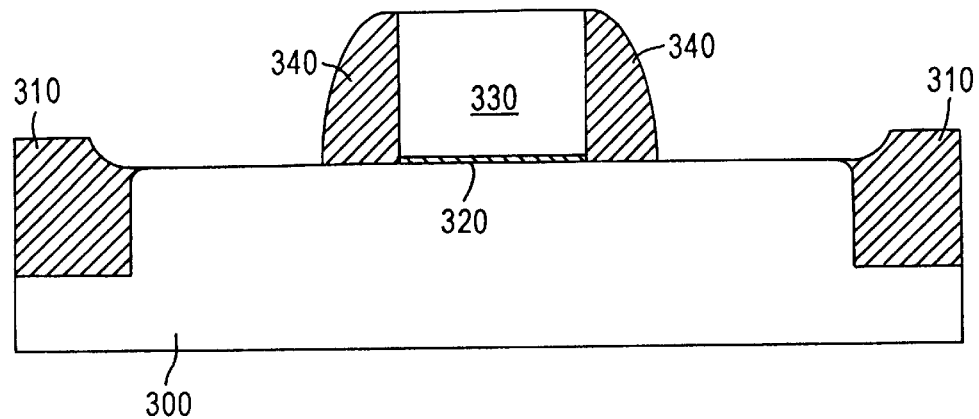
FIGS. 3A–3F schematically illustrate sequential phases of a method in accordance with an embodiment of the present invention.

An embodiment of the present invention is illustrated in FIGS. 3A–3F. As shown in FIG. 3A, field oxide regions 310 are formed on substrate 300, as by LOCOS or STI, followed by thermally growing gate oxide layer 320 and a polysilicon gate 330, typically by low pressure chemical vapor deposition (LPCVD), masking and etching. Dielectric spacers 340 are thereafter formed on sidewalls of gate 330, such as silicon dioxide by LPCVD and anisotropically etched.

Figure 3B:
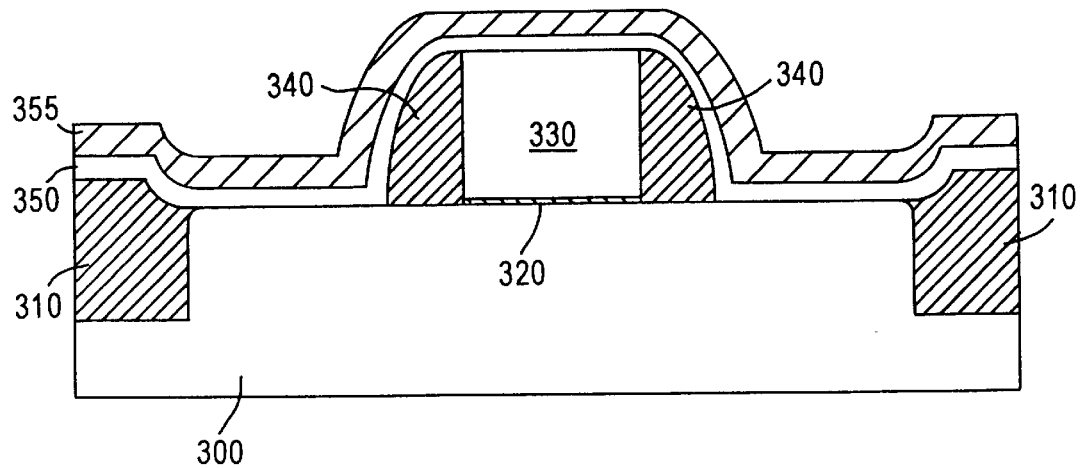
Figure 3C:
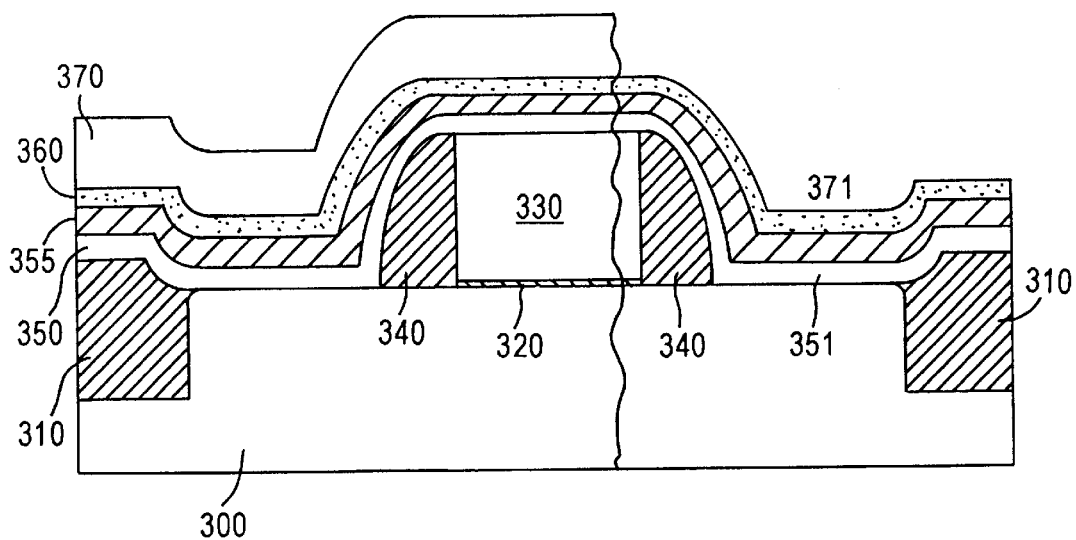

Referring to FIG. 3B, a layer of cobalt 350 is deposited across substrate 300, including field oxide regions 310, spacers 340 and gate 330, as by sputtering. A cap layer 355 of titanium, titanium nitride or a derivative thereof is then deposited on cobalt layer 350, as by sputtering to a thickness of about 50 Å, to prevent contaminants such as ambient oxygen or nitrogen from interfering with the subsequent silicidation reaction between cobalt 350 and substrate 300. A first doped film 360 is deposited on cap layer 355, as by LPCVD (see FIG. 3C). First doped film 360 is doped with a first conductivity type of impurity, either an n-type impurity such as phosphorus or arsenic, or a p-type impurity such as boron or indium, which will subsequently dope substrate 300 to form source/drain regions having ultra-shallow junctions. First doped film 360 is formed of a material which allows the impurities to diffuse out, such as silicon dioxide, silicon oxynitride or silicon nitride.

Figure 3D:
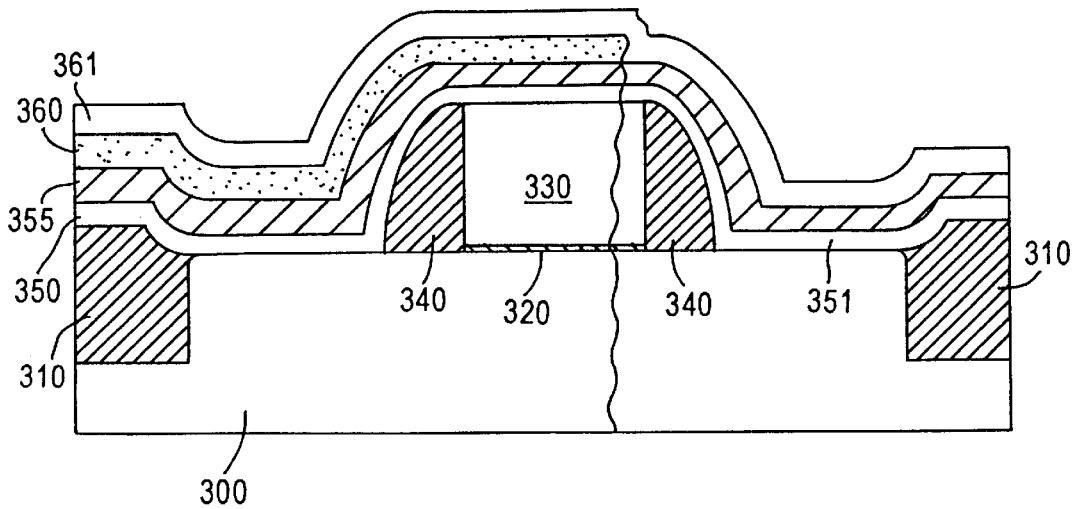

A photoresist mask 370 is formed on first doped film 360, and has openings 371 corresponding to selected portions 351 of cobalt layer 350 which are not to receive dopant from first doped film 360. First doped film 360 is then etched to expose selected portions 351 of cobalt layer 350, and a second doped film 361 is deposited over selected portions 351 and over first doped film 360, as depicted in FIG. 3D. Second doped film 361 is doped with a second conductivity type of impurity different than the first impurity type of first doped film 360, and like first doped film 360 can be silicon dioxide, silicon oxynitride or silicon nitride, deposited as by LPCVD, and contain impurities such as boron, arsenic, phosphorus, or indium depending on its impurity type.

Figure 3E:
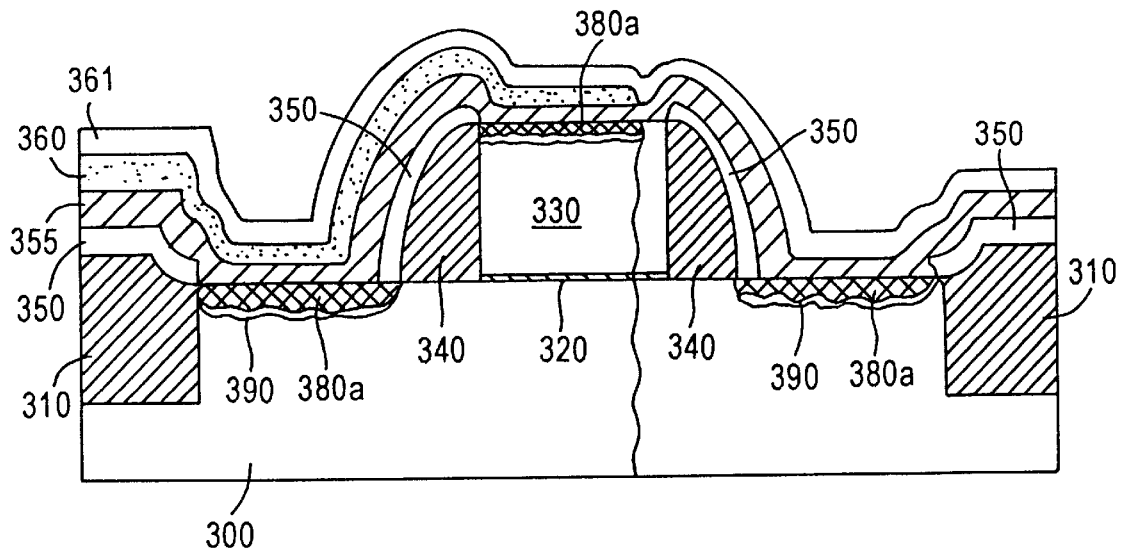

Next, referring to FIG. 3E, a low temperature RTA is performed at about 400° C. to about 600° C.; e.g., about 470° C., to cause portions of cobalt layer 350 above the silicon of gate 330 and substrate 300 to react and form a high resistivity first-phase cobalt silicide 380a. Cap layer 355 and portions of cobalt layer 350 above field oxide regions 310 and dielectric spacers 340 do not react to form a silicide, so cobalt silicide 380a is self-aligned to gate 330 and the intended source/drain regions of substrate 300. During cobalt silicide 380a formation, impurities diffuse out of first and second doped films 360, 361, through cap layer 355 and into cobalt silicide 380a. In another embodiment of the invention, the low temperature RTA is performed such that impurities are diffused through cobalt silicide 380a and into gate 330 and source/drain regions 390 below cobalt silicide 380a. Because the impurities readily diffuse through cap layer 355 and cobalt silicide 380a, source/drain regions 390 are formed self-aligned to the cobalt silicide/silicon interface, independent of the cobalt silicide/silicon interface shape. In other words, the bottom of source/drain regions 390 correspond to the shape of the bottom of cobalt silicide 380a.

Figure 3F:
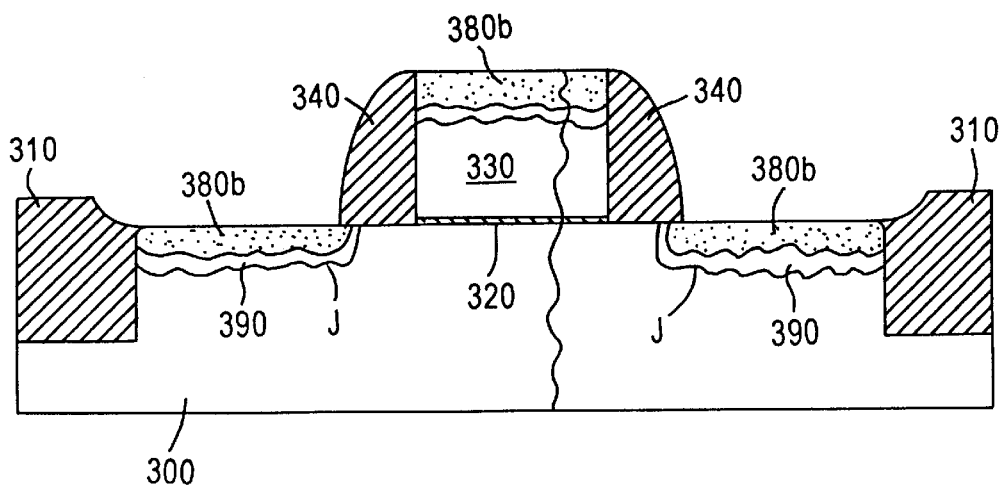

Thereafter, first and second doped films 360, 361, cap layer 355 and the unreacted portions of cobalt layer 350 above field oxide regions 310 and spacers 340 are stripped away, as by wet etching, and a high-temperature RTA is performed at about 700° C. to about 900° C.; e.g., about 825° C., to convert high resistivity cobalt silicide 380a into a second-phase low-resistivity cobalt silicide 380b and to diffuse the impurities into source/drain regions 390 in substrate 300 to form shallow junctions J at a depth of about 2000 Å or less; e.g., about 500 Å (see FIG. 3F). Junctions J are self-aligned to the low resistivity cobalt silicide/silicon interface; i.e., the shape of junction J corresponds to the shape of the bottom of cobalt silicide 380b, thus assuring a sufficient distance between the bottom of cobalt silicide 380b and junction J to avoid junction leakage, regardless of the interface shape and the cobalt silicide thickness.

Each of the first doped film 360 and the second doped film 361 have an impurity concentration great enough to form junctions J; i.e., an impurity concentration of about 1% to about 10%, or about $6\times10^{21}$ cm$^{-2}$ to about $6\times10^{23}$ cm$^{-2}$. First and second doped layers 360, 361 are deposited to a thickness sufficient to contain at least the minimum amount of dopant, but are preferably not deposited to a thickness too great to permit their easy removal by wet etching after performing the low temperature RTA; e.g., about 100 Å to about 700 Å.

Second doped film 361 partially overlays first doped film 360, as depicted in FIGS. 3D and 3E; however, the second conductivity type of impurity, initially carried by second doped film 361, should not be allowed to diffuse through the first doped filn 360 (during the low temperature RTA) and counter-dope source/drain regions 390. The diffusion of the second conductivity type of impurity through first doped film 360 is substantially prevented if the diffusion process is completed before an unacceptably large amount of the second type of impurity has sufficient time to diffuse through first doped film 360. This can be achieved by providing a first conductivity type of impurity (carried by first doped film 360) having a higher rate of diffusion than the second conductivity type of impurity; for example, providing first doped film 360 having a p-type impurity, and second doped film 361 having an n-type impurity. Additionally, unwanted diffusion of the second conductivity type of impurity through first doped film 360 can be reduced by depositing first doped layer 360 to a greater thickness than second doped layer 361.

Disadvantageous diffusion of the second conductivity type of impurity through first doped film 360 can also be substantially prevented by providing the first conductivity type of impurity with a concentration in first doped film 360 higher than a concentration of the second conductivity type of impurity in second doped film 361, since a quantity of impurities sufficient to adversely counter-dope source/drain regions 390 cannot diffuse from second doped film 361 through first doped film 360 if first doped film 360 contains substantially more dopant than second doped film 361.

Figure 4A:
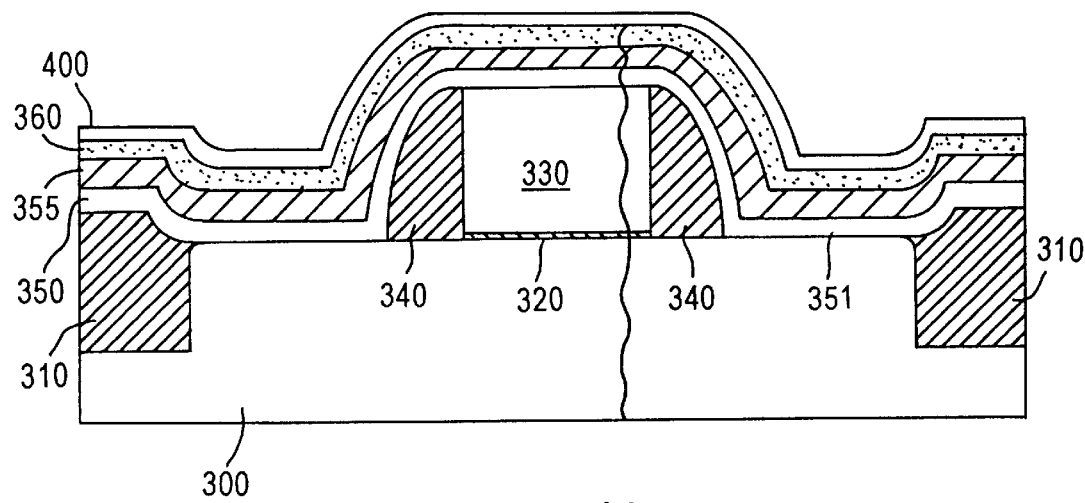
FIGS. 4A–4B schematically illustrate sequential phases of a method in accordance with another embodiment of the present invention.
Figure 4B:
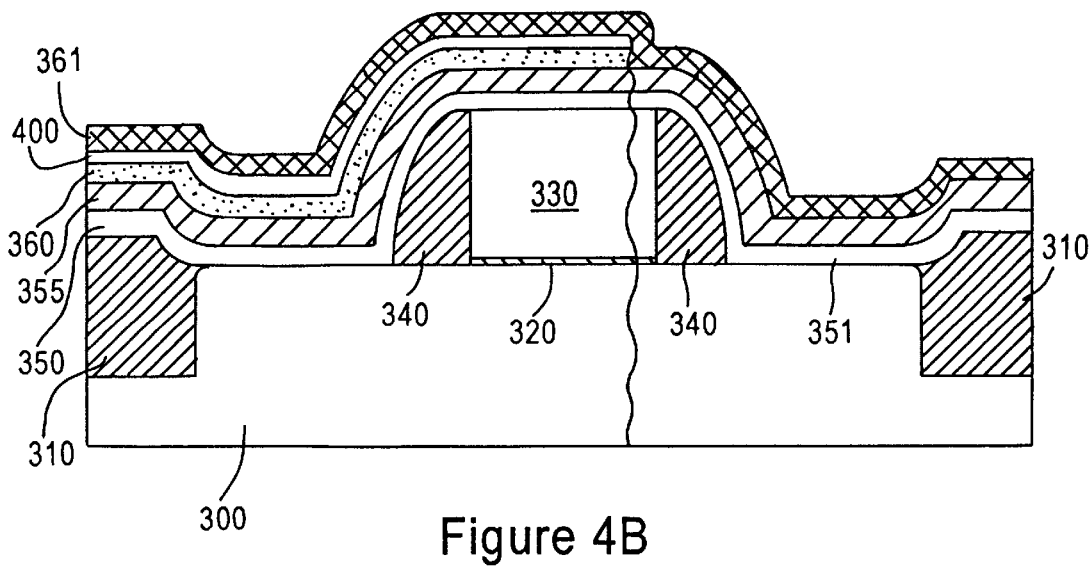

Another way to prevent the second conductivity type of impurity from diffusing through first doped film 360 is to form first doped film 360 of silicon oxynitride or silicon nitride and second doped film 361 of silicon dioxide. Nitrogen in the first doped film 360 substantially blocks the diffusion of dopants from second doped film 361. In another embodiment of the present invention, as shown in FIG. 4A, a skin of nitrogen 400 is grown on first doped film 360, as by annealing first doped film 360 in a nitrogen atmosphere after first doped film 360 has been deposited, then depositing second doped film 361 (see FIG. 4B). Nitrogen effectively blocks the diffusion of impurities, such as boron. Thus, it is advantageous to form first doped film 360 with an n-type impurity (e.g., silicon dioxide doped with arsenic), grow nitrogen skin 400 on first doped film 360, then form second doped film 361 with boron as the second conductivity type of impurity. Nitrogen skin 400 between first and second doped films 360, 361 substantially blocks diffusion of the boron out of second doped film 361 into first doped film 360.

The methodology of the present invention enables formation of shallow source/drain regions having ultra-shallow junctions of high integrity with cobalt silicide contacts of optimized thickness thereon. By depositing cobalt prior to forming the source/drain implants, and then diffusing impurities through the cobalt silicide layer to form the source/drain regions during silicide formation, ultra-shallow junctions are formed with a constant spacing from the uneven cobalt silicide/silicon interface. Unlike conventional practices, the present invention enables cobalt silcide formation which is sufficiently spaced apart from the source/drain junctions to avoid junction leakage, regardless of the shape of the cobalt silicide/silicon interface or the thickness of the cobalt silicide layer. Thus, the present methodology facilitates device scaling by enabling the formation of low-resistivity silicided source/drain regions having ultra-shallow junctions without silicide-related junction leakage. The present invention is applicable to the manufacture of various types of semiconductor devices having silicided source/drain regions, particularly high density semiconductor devices having a design rule of about 0.18 μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a metal layer on a main surface of a semiconductor substrate;

forming a cap layer on the metal layer;

forming a doped layer having impurities on the cap layer;

heating at a first temperature to form a first-phase metal silicide layer and to diffuse the impurities into the first-phase metal silicide layer;

etching to remove the doped layer and the cap layer; and heating at a second temperature to form a second-phase metal silicide layer having a resistivity lower than that of the first-phase metal silicide layer, and to diffuse the impurities into the substrate to form source/drain regions having a junction depth below the second-phase metal silicide layer.

2. The method according to claim 1, wherein the second-phase metal silicide has an irregular surface with the substrate and the source/drain junctions are substantially equidistant from the irregular surface.

3. The method according to claim 2, wherein the metal layer comprises cobalt, the first-phase metal silicide comprises cobalt silicide and the second-phase metal silicide comprises cobalt silicide.

4. The method according to claim 3, comprising:
heating at the first temperature by rapid thermal annealing at about 400° C. to about 600° C.; and
heating at the second temperature by rapid thermal annealing at about 700° C. to about 900° C.

5. The method according to claim 4, comprising heating at the first temperature by rapid thermal annealing at about 470° C., and heating at the second temperature by rapid thermal annealing at about 825° C.

6. The method according to claim 3, wherein the source/drain junctions have a depth of about 2000 Å or less.

7. The method according to claim 6, wherein the source/drain junctions have a depth of about 500 Å or less.

8. The method according to claim 1, comprising depositing the doped layer at a thickness of about 100 Å to about 700 Å.

9. The method according to claim 1, comprising forming the doped layer with an impurity concentration of about 1% to about 10%.

10. The method according to claim 1, comprising forming the doped layer with an impurity concentration of about $6 \times 10^{21}$ cm$^{-2}$ to about $6 \times 10^{23}$ cm$^{-2}$.

11. The method according to claim 1, comprising forming the doped layer by:
forming a first doped film comprising a first conductivity type of impurity on the cap layer;
providing a mask on the first doped film, the mask having openings over portions of the cap layer;
etching the first doped film to expose the portions of the cap layer; and
forming a second doped film comprising a second conductivity type of impurity on the first doped film and the exposed portions of the cap layer;
wherein the second conductivity type of impurity does not substantially diffuse through the first doped film during heating at the first temperature.

12. The method according to claim 11, wherein the first and second doped films each comprise silicon dioxide or silicon oxynitride.

13. The method according to claim 11, wherein the first conductivity type of impurity has a higher rate of diffusion than the second conductivity type of impurity.

14. The method according to claim 13, wherein the first conductivity type of impurity comprises a p-type impurity and the second conductivity type of impurity comprises an n-type impurity.

15. The method according to claim 11, wherein the first doped film comprises silicon oxynitride or silicon nitride and the second doped film comprises silicon dioxide.

16. The method according to claim 11, further comprising forming a skin of nitrogen on the first doped film to substantially prevent the second conductivity type of impurity from diffusing through the first doped film while heating at the first temperature.

17. The method according to claim 16, wherein the first conductivity type of impurity comprises an n-type impurity and the second conductivity type of impurity comprises boron.

18. The method according to claim 17, comprising forming the nitrogen skin by annealing the first doped film in a nitrogen atmosphere.

19. The method according to claim 11, wherein a concentration of the first conductivity type of impurity in the first doped film is higher than a concentration of the second conductivity type of impurity in the second doped film, to substantially prevent the second conductivity type of impurity from diffusing through the first doped film while heating at the first temperature.

20. The method according to claim 11, wherein the first doped film has a thickness greater than a thickness of the second doped film to substantially prevent the second conductivity type of impurity from diffusing through the first doped film while heating at the first temperature.

21. The method according to claim 1, comprising:
forming conductive gates and dielectric field oxide regions on the main surface;
forming dielectric spacers on side surfaces of the gates;
forming the metal layer, the cap layer and the doped layer on the field oxide regions, spacers, and top surfaces of the gates; and
etching to remove the metal layer, cap layer and the doped layer from the field oxide regions and the spacers after forming the first-phase metal silicide layer.

22. The method according to claim 1, comprising heating at the first temperature to diffuse the impurities into the substrate.

23. The method according to claim 1, wherein the cap layer comprises titanium or titanium nitride.

* * * * *